US012684735B2

(12) United States Patent     (10) Patent No.:   US 12,684,735 B2

Fu et al.          (45) Date of Patent:     Jul. 14, 2026

(54) HEAT DISSIPATION MECHANISM AND ELECTRONIC DEVICE HAVING THE SAME

(71) Applicants: CHAMP TECH OPTICAL (FOSHAN) CORPORATION, Foshan (CN); Foxconn Technology Co., Ltd., New Taipei (TW)

(72) Inventors: Meng Fu, Foshan (CN); Jin-Rong Xie, Foshan (CN)

(73) Assignees: CHAMP TECH OPTICAL (FOSHAN) CORPORATION, Foshan (CN); Foxconn Technology Co., Ltd., New Taipei (TW)

( * ) Notice: Subject to any disclaimer, the term of this patent is extended or adjusted under 35 U.S.C. 154(b) by 269 days.

(21) Appl. No.: 18/671,900

(22) Filed: May 22, 2024

(65) Prior Publication Data

US 2025/0126756 A1     Apr. 17, 2025

(30) Foreign Application Priority Data

Oct. 13, 2023    (CN) .......................... 202311332626.8

(51) Int. Cl.
     *H05K 7/20*        (2006.01)

(52) U.S. Cl.
     CPC ..... *H05K 7/20418* (2013.01); *H05K 7/20263* (2013.01); *H05K 7/20445* (2013.01)

(58) Field of Classification Search
     CPC ...................... H05K 7/02; H05K 7/20; H05K 7/20218–2029; H05K 7/20254; H05K 7/20263; H05K 7/20272; H05K 7/20327; H05K 7/20336; H05K 7/20381; H05K 7/2039; H05K 7/20418; H05K 7/20445; H05K 7/20472; H05K 7/20636; H05K 7/20681; H05K 7/20772; H05K 7/20781; H05K 7/20927; H05K 1/0203; H05K 1/181; G06F 1/20; G06F 1/203; G06F 1/206;

(Continued)

(56) References Cited

U.S. PATENT DOCUMENTS

| | | | |
|---|---|---|---|
| 2009/0072386 A1* | 3/2009 | Hasegawa ............. | H10W 40/47 |
| | | | 257/E23.098 |
| 2019/0014686 A1* | 1/2019 | Nakamura ........... | H05K 5/0217 |
| 2019/0208665 A1* | 7/2019 | Tsai ................... | H05K 7/20254 |

(Continued)

*Primary Examiner* — Amir A Jalali

(74) *Attorney, Agent, or Firm* — ScienBiziP, P.C.

(57) ABSTRACT

A heat dissipation mechanism comprises a carrier assembly, a heat dissipation assembly, and a buckle assembly, the carrier assembly comprises a base configured for assembling an electronic component with a heat-conductive adhesive sheet attached; the heat dissipation assembly comprises a top plate and a crimping unit, the top plate defines a penetration hole, the crimping unit comprises an extruded sheet, the extruded sheet is located on the side of the heat-conductive adhesive sheet away from the electronic component, the side of the extruded sheet away from the heat-conductive adhesive sheet has a protrusion provided thereon; the buckle assembly comprises a cover plate and a cladding unit, the cladding unit comprises a resist member, the side of the resist member which facing the extruded sheet has a stop portion provided thereon. An electronic device is also provided, which comprising the provided heat dissipation mechanism, an electronic component, and a case.

20 Claims, 5 Drawing Sheets

100

(58) Field of Classification Search
CPC ... G06F 1/181; G06F 2200/201; H10W 40/47
See application file for complete search history.

(56) References Cited

U.S. PATENT DOCUMENTS

| | | | |
|---|---|---|---|
| 2022/0248566 A1* | 8/2022 | Chen | H05K 7/20272 |
| 2023/0284421 A1* | 9/2023 | Malouin | G06F 1/20 |
| 2024/0100636 A1* | 3/2024 | Lamy | B23P 15/26 |
| 2024/0105553 A1* | 3/2024 | Gertiser | B60L 15/007 |
| 2024/0389262 A1* | 11/2024 | Li | G06F 1/20 |

* cited by examiner

100

400

1

HEAT DISSIPATION MECHANISM AND ELECTRONIC DEVICE HAVING THE SAME

FIELD

This disclosure relates generally to electronic device dissipating heat technical field, and more specifically, to a heat dissipation mechanism and an electronic device having the same.

BACKGROUND

Electronic component such as memory and chips are one of the important components of the electronic devices. With the development of technology and the increase of computing power of electronic devices, the heat generation of electronic component also increases, when the temperature of electronic component is too high, the normal operation of electronic device will be affected.

Currently, a heat-conductive adhesive sheet is attached to the electronic component, a heat dissipation sheet is inserted into the electronic component and tightly attached to the heat-conductive adhesive sheet, the heat-conductive adhesive sheet and the heat dissipation sheet can dissipate heat from the electronic component. However, when the heat dissipation sheet is inserted into the electronic component, the heat-conductive adhesive sheet attached to the electronic component may be pushed off by the heat dissipation sheet, and there is a situation in which the heat dissipation sheet is not effectively attached to the heat-conductive adhesive sheet, which results in poor heat dissipation performance. Therefore, there is room for improvement within the art.

BRIEF DESCRIPTION OF THE DRAWINGS

Implementations of the present technology will now be described, by way of example only, with reference to the attached figures, wherein.

DETAILED DESCRIPTION

Figure 1:
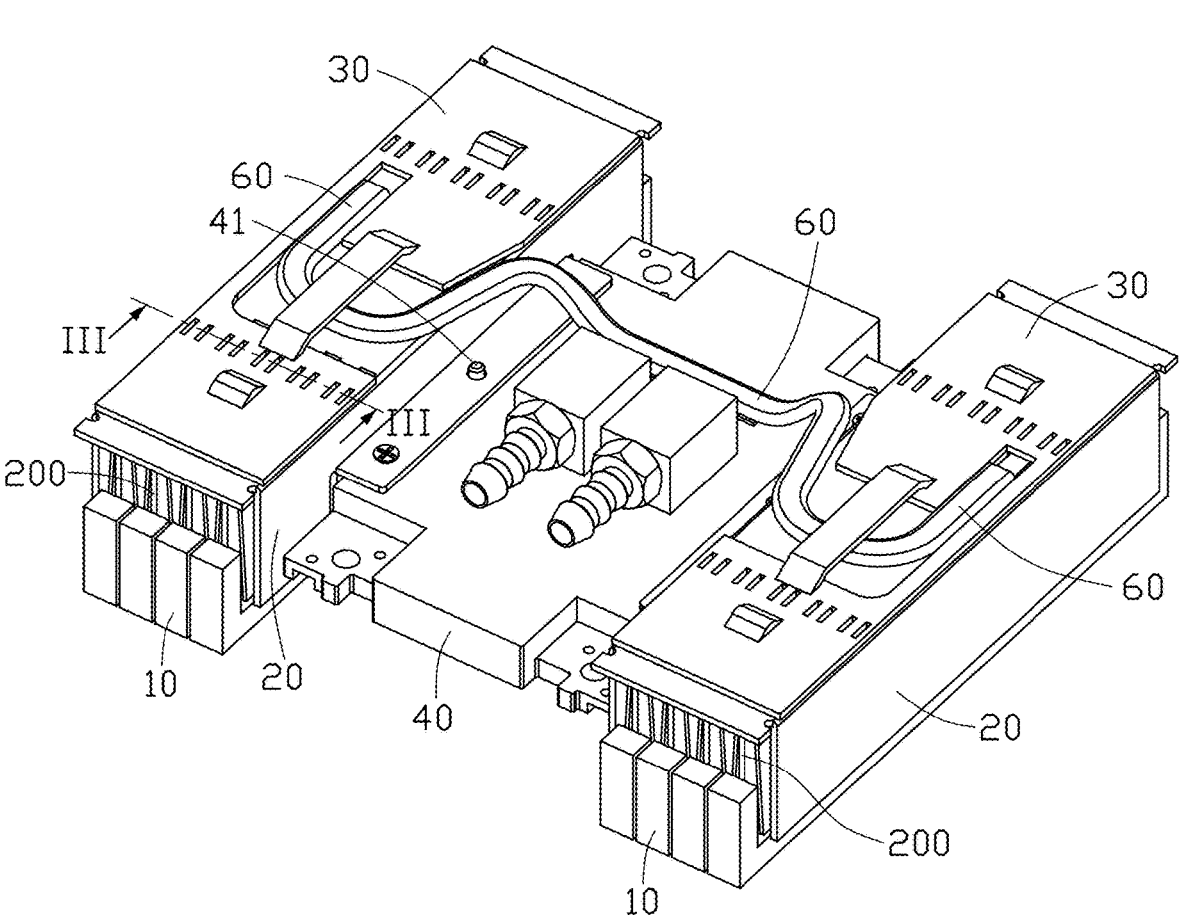
FIG. 1 is a perspective view of a heat dissipation mechanism in an embodiment of the disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

When a feature or element is herein referred to as being "on" another feature or element, it can be directly on the other feature or element or intervening features and/or elements may also be present. It will also be understood that, when a feature or element is referred to as being "connected" or "attached" to another feature or element, it can be directly connected, attached, or coupled to the other feature or element or intervening features or elements may be present.

In FIG. 1, a heat dissipation mechanism 100 is provided by an embodiment of the disclosure. The heat dissipation mechanism 100 is configured for assembling electronic components 200 and dissipating heat from the electronic components 200, the electronic components 200 may be memory, chips, etc. The heat dissipation mechanism 100 comprises a carrier assembly 10, a heat dissipation assembly 20, and a buckle assembly 30.

Figure 2:
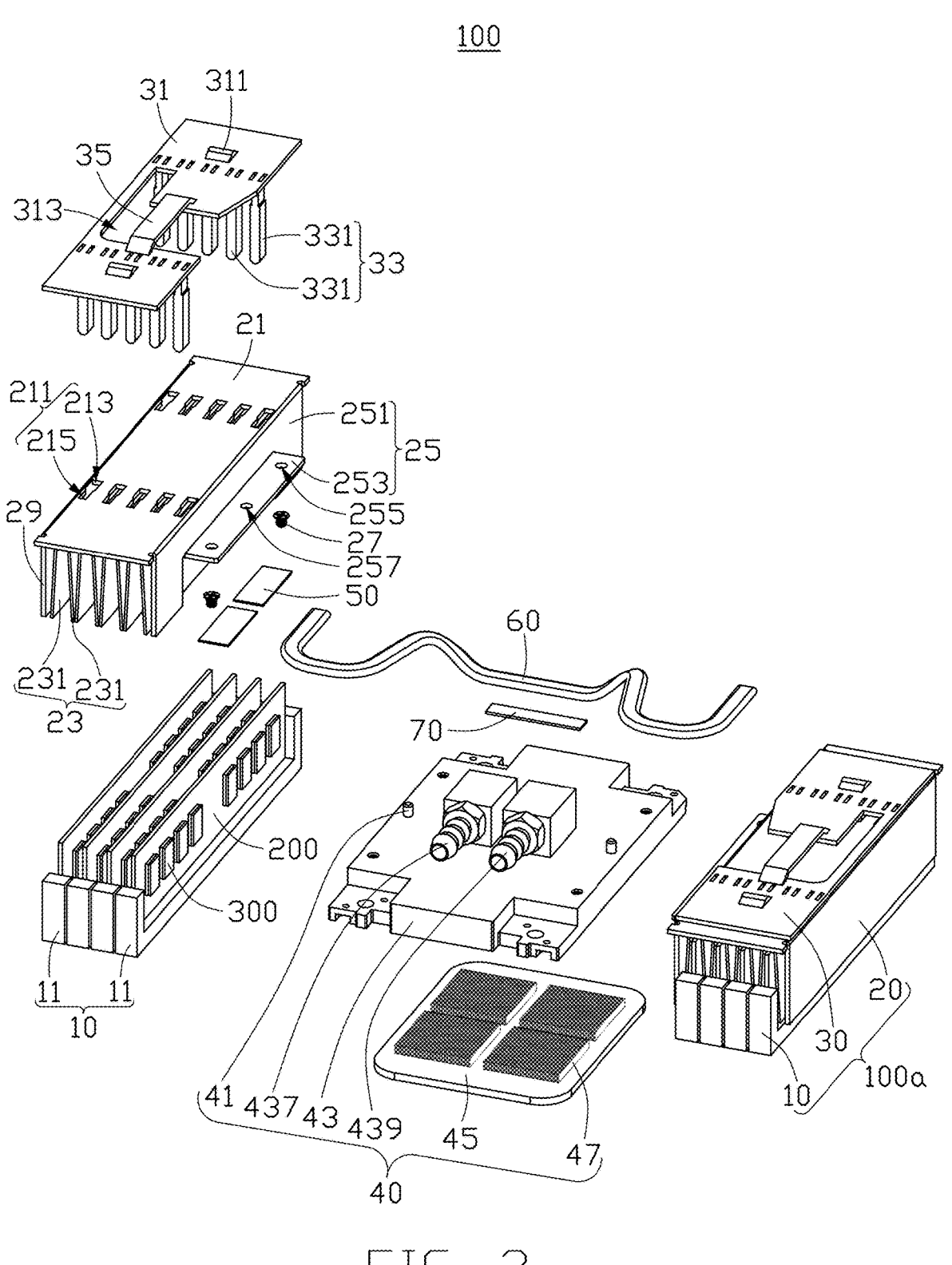
FIG. 2 is an exploded view of the heat dissipation mechanism in FIG. 1.
Figure 3:
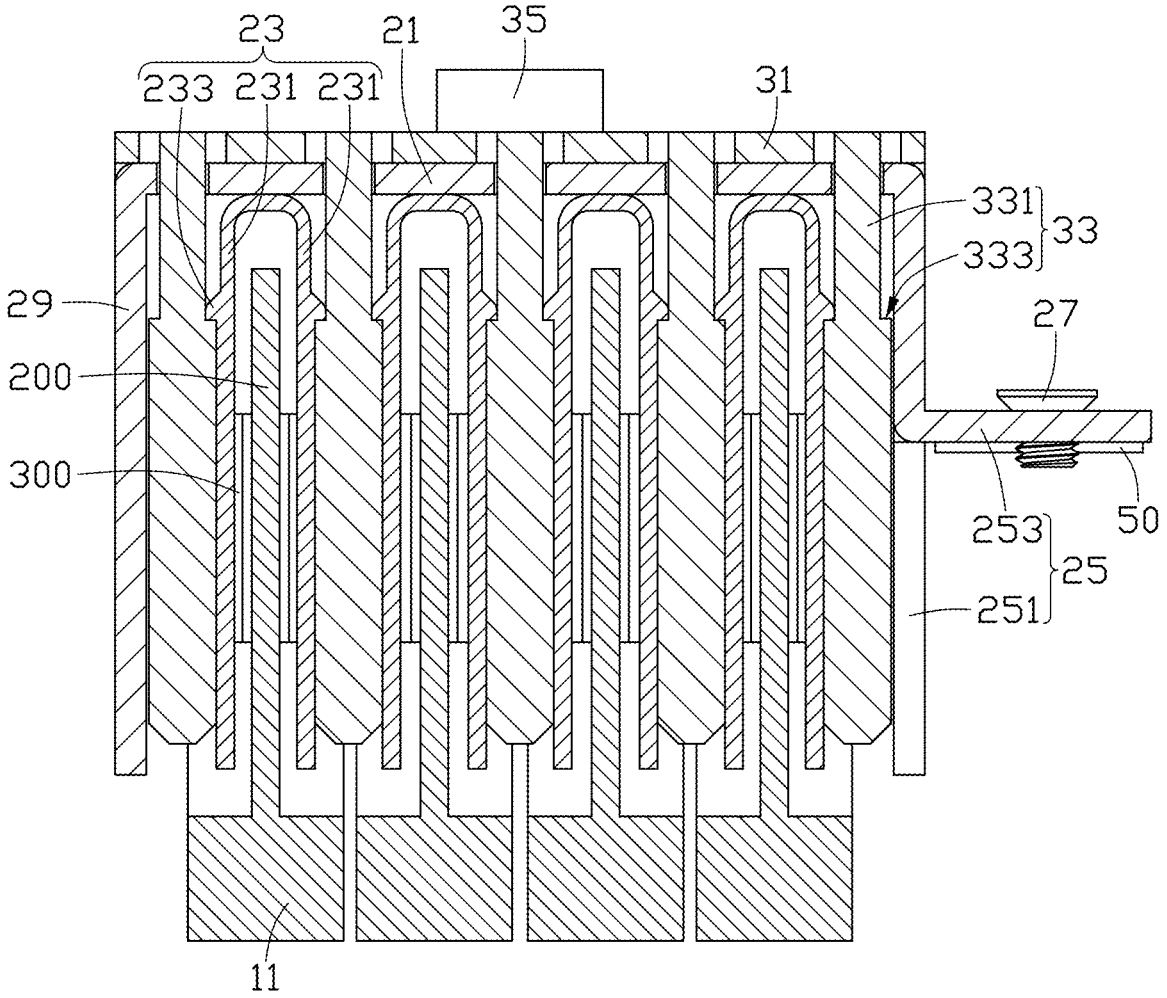
FIG. 3 is a cross-sectional view of the heat dissipation mechanism in FIG. 1 along III-III.

In FIG. 2 and FIG. 3, the carrier assembly 10 comprises four bases 11, the base 11 is configured for assembling the electronic components 200 with at least one heat-conductive adhesive sheet 300 attached thereon, the heat-conductive adhesive sheet 300 is configured for conducting the heat generated by the electronic components 200 out.

The heat dissipation assembly 20 comprises a top plate 21, and four crimping units 23, wherein the top plate 21 defines ten penetration holes 211, the length direction of the perforation holes 211 is the same as the length direction of the top plate 21, the crimping unit 23 is connected to one side of the top plate 21 and is provided corresponding to two adjacent perforation holes 211, the crimping unit 23 comprises two extruded sheets 231, which is connected with one side of the top plate 21 and is provided in correspondence with the heat-conductive adhesive sheet 300 away from the electronic component 200, from the end of the extruded sheet 231 connected to the top plate 21 to the end of the extruded sheet 231 away from the top plate 21, the extruded sheet 231 is inclined towards the side of heat-conductive adhesive sheet 300 away from the electronic component 200, the side of the extruded sheet 231 away from the heat-conductive adhesive sheet 300 has a protrusion 233 provided thereon, the heat dissipation assembly 20 is made of a material with strong thermal conductivity, such as copper, aluminum, iron, and the like.

The buckle assembly 30 comprises a cover plate 31 and a cladding unit 33, the cover plate 31 and the top plate 21 are provided in parallel, wherein the cladding unit 33 comprises four resist members 331 which is vertically attached to one side of the cover plate 31 and inserted into the penetration hole 211, the resist member 331 is configured for resisting against the extruded sheet 231 to the heat-conductive adhesive sheet 300 attached on the electronic component 200, the side of the resist member 331 which facing the extruded sheet 231 has a stop portion 333 provided thereon, the stop portion 333 of the resist member 331 is configured for resting against the protrusion 233 of the extruded sheet 231.

When the above heat dissipation mechanism 100 is used in practice, the electronic component 200 is assembled on the base 11, and the heat conductor portion 300 is affixed to both opposite sides of the electronic component 200, and the heat dissipation assembly 20 is inserted downwardly from the top of the base 11. Since the extruded sheet 231 is tilted away from the electronic component 200 towards the side of the heat-conductive adhesive sheet 300, it will not come into contact with the heat-conductive adhesive sheet 300 when inserted into the heat dissipation assembly 20. This design effectively prevents the extruded sheet 231 from touching and potentially dislodging the heat-conductive adhesive sheet 300. When inserting the heat dissipation assembly 20, the buckle assembly 30 is positioned from the top of the base 11, and the two resist members 331 are inserted into the corresponding penetration holes 211 on the top plate 21. The resist members 331 exert pressure against the extruded sheet 231, ensuring it remains in contact with the heat-conductive adhesive sheet 300, which is already affixed to the electronic component 200. This mechanism prevents poor contact between the extruded sheet 231 and the heat-conductive adhesive sheet 300, allowing the extruded sheet 231 to efficiently transfer heat away from the electronic component 200, thus effectively dissipating its heat. When the buckle assembly 30 is inserted and subsequently moved along the length of penetration hole 211, this action propels the resist member 331 to slide in the same direction. As a result, the stop portion 333 of the resist member 331 is positioned beneath the corresponding protrusion 233 on the resist sheet 231. This positioning resists the protrusion 233, effectively preventing the buckle assembly 30 from detaching from the heat dissipation assembly 20. Consequently, the stability of the entire heat dissipation mechanism 100 is enhanced.

The heat dissipation mechanism 100 further comprises a heat exchange assembly 40, which is configured for exchanging heat with the heat dissipation assembly 20, wherein the heat exchange assembly 40 is located on one side of the carrier assembly 10, the heat dissipation assembly 20 further comprises a connection member 25 located on one side of the crimping unit 23, the connection member 25 is connected to the heat exchange assembly 40 and the top plate 21 of the heat dissipation assembly.

The connection member 25 comprises a main body 251, and an extension 253, the main body 251 is substantially in the shape of a U-shaped plate, the main body 251 is connected to the top plate 21 of the heat dissipation assembly 20 and is located on one side of the crimping unit 23, the extension 253 is vertically connected to the middle of the main body 251, one end of the extension 253 away from the main body 251 extends back towards the crimping unit 23 and connects to the heat exchange assembly 40.

The end of the extension 253 away from the main body 251 defines two bolt holes 255, and the connection member 25 connects with the heat exchange assembly 40 by a screw 27 through the bolt hole 255 and the heat exchange assembly 40.

The heat exchange assembly 40 has a positioning post 41 provided thereon, the extension 253 further defines a positioning hole 257 which positioned between two the bolt holes 255, the positioning post 41 is configured for adapting to the positioning hole 257.

The heat dissipation assembly 20 further comprises a side plate 29, which is connected to the top plate 21. The side plate 29 is positioned on the side of the crimping unit 23 that is opposite to the connection member 25. By arranging the components in this manner, the crimping unit 23 is shielded from direct impact by external mechanisms, reducing the risk of deformation.

The heat dissipation mechanism 100 further comprises a heat conductor portion 50 located on a connection between the heat exchange assembly 40 and the connection member 25, the heat conductor portion 50 is attached between the heat exchange assembly 40 and the connection member 25. As a result, the heat dissipation assembly 20 can more effectively transfer heat to the heat exchange assembly 40, thereby improving the overall thermal management capabilities of the heat dissipation mechanism 100.

The heat dissipation mechanism 100 further comprises a heat conductor strip 60, and a thermal conductivity sheet 70, the thermal conductivity sheet 70 is attached to the heat exchange assembly 40, the heat conductor strip 60 is attached to the thermal conductivity sheet 70, and an end of the heat conductor strip 60 is attached between the top plate 21 of the heat dissipation assembly 20 and the cover plate 31, the end of the heat conductor strip 60 has a U-shaped structure, the heat conductor strip 60 can be made of copper, aluminum, iron, and other materials having strong thermal conduction. Consequently, the heat dissipation assembly 20 is engineered to efficiently channel heat towards the heat exchange assembly 40.

The thermal conductivity sheet 70, the heat-conductive adhesive sheet 50, and the heat-conductive adhesive sheet 300 are made of silicone, gel, or paste.

The mechanism 100 comprises two heat dissipation modules 100a, the heat dissipation module 100a comprises a carrier assembly 10, a heat dissipation assembly 20, and a buckle assembly 30, the heat exchange assembly 40 is connected to each of the two extensions, the ends of the heat conduction strips 60 is attached to the corresponding top plate 21 of the two heat dissipation modules 100a, the middle portion of the heat conduction strip 60 is attached to the thermal conductivity sheet 70. By this arrangement, a single heat exchange assembly 40 effectively cools two heat dissipation modules 100a, enhancing the utilization rate of the heat exchange assembly 40.

It is clear that the heat conductor strip 60, the heat exchange assembly 40, and the heat dissipation assembly 20 are interconnected using methods such as welding, screw fastening, or unibody molding.

The penetration hole 211 comprises a first hole 213, and a communicated second hole 215. Positioned opposite the protrusion 233, the second hole 215 is aligned with the width direction of the penetration hole 211. The first hole 213, which is larger than the second hole 215, is designed to facilitate the insertion of the resist member 331. Meanwhile, the second hole 215 is adapted to accommodate the resist member 331, allowing the stop portion 333 to effectively resist the protrusion 233.

It can be understood that, in other embodiments, the protrusion 233 may be omitted, the stop portion 333 may be provided to extend upwardly to the underside of the top plate 21, wherein the stop portion 333 of the resist member 331 is configured for resting against the top plate 21 of the heat dissipation assembly 20.

The cover plate 31 comprises a pushback portion 311, which is located on a side of the cover plate 31 that is opposite to the cladding unit 33, the pushback portion 311 is configured for receiving an external force that can actuate the movement of both the cover plate 31 and the cladding unit 33. The external force could originate from manual operation, mechanical actuation, or similar actions.

The cover plate 31 defines an avoidance hole 313 thereon, the buckle assembly 30 further comprises a handle 35 connected to the cover plate 31, the handle 35 passes through the avoidance hole 313. By incorporating the avoidance hole 313, the weight of the cover plate 31 is reduced, which simplifies the removal process of the buckle assembly 30. Additionally, the avoidance hole 313 creates the necessary clearance for the heat conductor strip 60, allowing for easier attachment to the top plate 21. Furthermore, the inclusion of the handle 35 aids in the insertion and extraction of the buckle assembly 30, enabling the coordinated movement of the cover plate 31 and the cladding unit 33.

The end of the resist member 331 that is opposite to the cover plate 31 is provided with a conical shape. This configuration facilitates the insertion of the resist member 331 between the two resist sheets 231.

Figure 4:
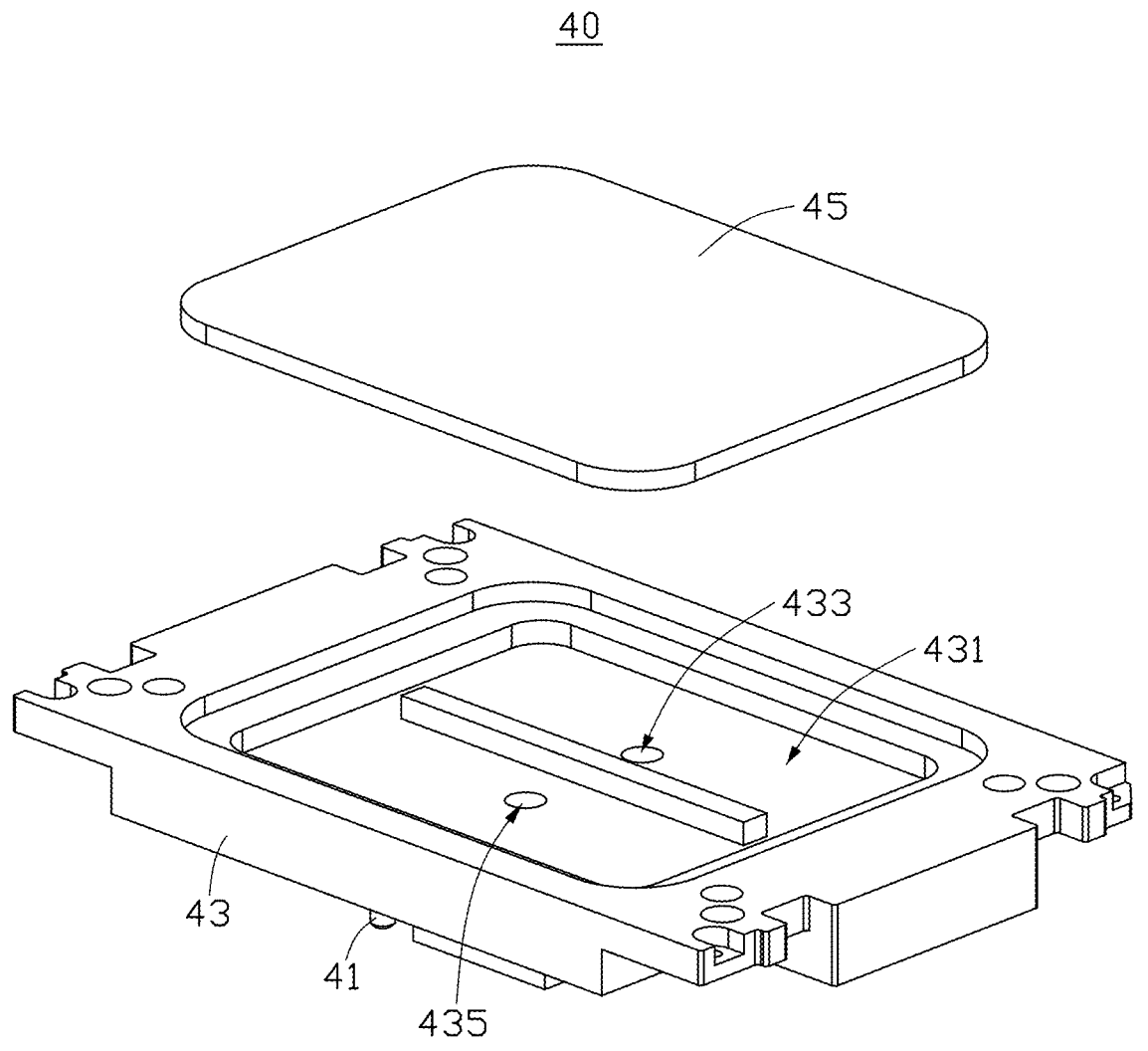
FIG. 4 is an exploded view of a heat exchange assembly of the heat dissipation mechanism in FIG. 1.

In FIG. 2 and FIG. 4, the heat exchange assembly 40 comprises a housing 43, a base plate 45, and a plurality of fins 47. The housing 43 defines an accommodating cavity 431, an inlet 433, and an outlet 435, both of the inlet 433 and the outlet 435 are communicated with the accommodating cavity 431. A locating post 41 is located on the housing 43. The base plate 45 is affixed to the housing 43 and situated within in the accommodating cavity 431. The plurality of fins 47 are evenly distributed across the base plate 45 and also reside within the accommodating cavity 431. The inlet 433 is configured for introducing the liquid medium into the containment cavity 431, enabling the liquid medium to circulate through the plurality of fins 47. Conversely, the outlet 435 is designed to expel the liquid medium from the containment cavity 431. Consequently, a liquid medium entering through the inlet 433 can traverse the space between the fins 47, absorbing heat from the housing 43. Suitable liquid mediums might include cooling water, refrigerant, or any other fluid capable of engaging in thermal exchange with the housing 43.

The inlet 433 is connected to a first connector 437, the outlet 435 is connected to a second connector 439, the first connector 437 is configured for introducing the liquid medium into the inlet 433, the second connector 439 is configured for leading the liquid medium out of the outlet 435. In this manner, the external liquid circulation system can continuously supply the heat exchange assembly 40 with a liquid medium, thereby enhancing its heat exchange efficiency.

Figure 5:
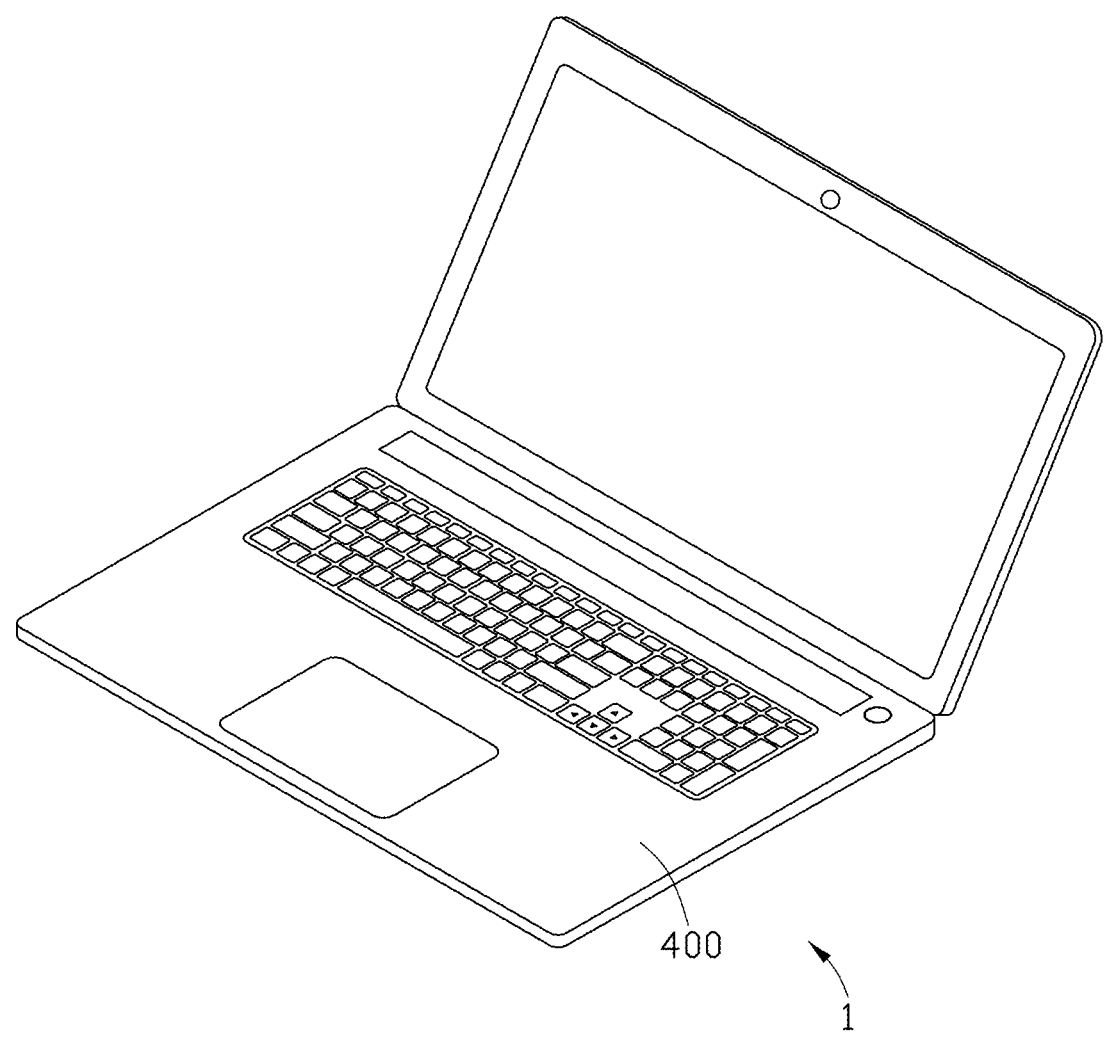
FIG. 5 is a perspective view of an electronic device in an embodiment of the disclosure.

In FIG. 5, an electronic device 1 is provided by an embodiment of the disclosure. The electronic device 1 comprises a heat dissipation mechanism 100 as mentioned above, an electronic component 200 shown in FIG. 1, and a case 400, the electronic component 200 is attached with a heat-conductive adhesive sheet 300 thereon, the electronic component 200 and the heat dissipation mechanism 100 being positioned in the case 400.

The electronic device 1 may be a laptop computer, a mobile phone, a tablet computer, a smart watch, smart glasses, a camera, a television set, a refrigerator, or other device capable of being used to a heat-generating device such as a memory, a chip.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A heat dissipation mechanism, comprising:
   a carrier assembly, comprises a base configured for assembling an electronic component with a heat-conductive adhesive sheet attached;
   a heat dissipation assembly, comprises a top plate and a crimping unit, wherein the top plate defines a penetration hole, the crimping unit comprises an extruded sheet which is connected with one side of the top plate and is provided in correspondence with the heat-conductive adhesive sheet, the extruded sheet is located on the side of the heat-conductive adhesive sheet away from the electronic component, from the end of the extruded sheet connected to the top plate to the end of the extruded sheet away from the top plate, the extruded sheet is inclined towards the side of the heat-conductive adhesive sheet away from the electronic component, the side of the extruded sheet away from the heat-conductive adhesive sheet has a protrusion provided thereon; and
   a buckle assembly, comprises a cover plate and a cladding unit, wherein the cladding unit comprises a resist member which is attached to one side of the cover plate and inserted into the penetration hole, the resist member is configured for resisting against the extruded sheet to the heat-conductive adhesive sheet attached on the electronic component, the side of the resist member which facing the extruded sheet has a stop portion provided thereon, the stop portion of the resist member is configured for resting against the protrusion of the extruded sheet.

2. The heat dissipation mechanism of claim 1, further comprising:
   a heat exchange assembly located on one side of the carrier assembly, which is configured for exchanging heat with the heat dissipation assembly, wherein the heat dissipation assembly further comprises a connection member located on one side of the crimping unit, the connection member is connected to the heat exchange assembly and the top plate of the heat dissipation assembly.

3. The heat dissipation mechanism of claim 2, wherein the connection member comprises:
   a main body connected to the top plate of the heat dissipation assembly, and located on one side of the crimping unit; and
   an extension connected to the main body, one end of the extension away from the main body extends back towards the crimping unit and connects to the heat exchange assembly.

4. The heat dissipation mechanism of claim 3, wherein the end of the extension away from the main body defines at least two bolt holes, and the connection member connects with the heat exchange assembly by a screw through the bolt hole and the heat exchange assembly.

5. The heat dissipation mechanism of claim 4, wherein the heat exchange assembly has a positioning post provided thereon, the extension further defines a positioning hole which positioned between at least two of the bolt holes, the positioning post is configured for adapting to the positioning hole.

6. The heat dissipation mechanism of claim 5, wherein the heat exchange assembly further comprises:
   a housing, the housing defines an accommodating cavity, an inlet and an outlet, both of the inlet and the outlet are communicated with the accommodating cavity, the positioning post is located on the housing;
   a base plate, the base plate connects the housing and locates in the accommodating cavity; and
   a plurality of fins, the plurality of the fins are uniformly positioned on the base plate and located in the accommodating cavity, the inlet is configured for introducing a liquid medium into the accommodating cavity resulting the liquid medium flows between the plurality of the fins, and the outlet is configured for directing the liquid medium out of the accommodating cavity.

7. The heat dissipation mechanism of claim 6, wherein the inlet is connected to a first connector, the outlet is connected to a second connector, the first connector is configured for introducing the liquid medium into the inlet, the second connector is configured for leading the liquid medium out of the outlet.

8. The heat dissipation mechanism of claim 3, further comprising:
   a thermal conductivity sheet attached to the heat exchange assembly; and
   a heat conductor strip attached to the thermal conductivity sheet, and an end of the heat conductor strip is attached between the top plate of the heat dissipation assembly and the cover plate of the buckle assembly.

9. The heat dissipation mechanism of claim 8, wherein the end of the heat conductor strip has a U-shaped structure.

10. The heat dissipation mechanism of claim 8, wherein the heat conductor strip and the thermal conductivity sheet are made of silicone, gel, or paste.

11. The heat dissipation mechanism of claim 8, wherein the heat dissipation mechanism comprises two heat dissipation modules, the heat dissipation module comprises the carrier assembly, the heat dissipation assembly and the buckle assembly, the heat exchange assembly is connected to each of the two extensions, the ends of the heat conduction strip is attached to the corresponding top plate of the two heat dissipation modules, and the middle portion of the heat conduction strip is attached to the heat-conductive adhesive sheet.

12. The heat dissipation mechanism of claim 8, wherein the heat conductor strip, the heat exchange assembly and the heat dissipation assembly are connected to each other by one of welding, screw, and unibody molding.

13. The heat dissipation mechanism of claim 2, wherein the heat dissipation assembly further comprises:
   a side plate connected to the top plate of the heat dissipation assembly, and the side plate is located on the side of crimping unit away from the connection member.

14. The heat dissipation mechanism of claim 2, further comprising a heat conductor portion located at a connection between the heat exchange assembly and the connection member, the heat conductor portion is attached between the heat exchange assembly and the connection member.

15. The heat dissipation mechanism of claim 1, wherein the penetration hole comprises a first hole and a communicated second hole, the second hole is provided opposite the protrusion, the size of the first hole is greater than the second hole, the first hole is configured to enable insertion of the resist member, the second hole is configured to adapt to the resist member to enable the stop portion resisting the protrusion.

16. The heat dissipation mechanism of claim 1, wherein the cover plate comprises a pushback portion provided on a side of the cover plate away from the cladding unit, the pushback portion is configured for accepting an external force to move the cover plate and the cladding unit.

17. The heat dissipation mechanism of claim 1, wherein the cover plate defines an avoidance hole, the buckle assembly further comprises a handle connected to the cover plate, the handle passes through the avoidance hole.

18. The heat dissipation mechanism of claim 1, wherein the end of the resist member away from the cover plate is provided with a conical shape.

19. A heat dissipation mechanism, comprising:
   a carrier assembly, comprises a base configured for assembling an electronic component with a heat-conductive adhesive sheet attached;
   a heat dissipation assembly, comprises a top plate and a crimping unit, wherein the top plate defines a penetration hole, the crimping unit comprises an extruded sheet, the extruded sheet which is connected with one side of the top plate and provided in correspondence with the heat-conductive adhesive sheet, the extruded sheet is located on the side of the heat-conductive adhesive sheet away from the electronic device, from the end of the extruded sheet connected to the top plate to the end of the extruded sheet away from the top plate, the extruded sheet is inclined towards a side of the heat-conductive adhesive sheet away from the electronic device; and
   a buckle assembly, comprises a cover plate and a cladding unit, wherein the cladding unit comprises a resist member which is attached to one side of the cover plate and inserted into the penetration hole, the resist member is configured for resisting against the extruded sheet to the heat-conductive adhesive sheet attached on the electronic component, the side of the resist member which facing the extruded sheet has a stop portion provided thereon, the stop portion of the resist member is configured for resting against the top plate of the heat dissipation assembly.

20. An electronic device, comprising:
   an electronic component with a heat-conductive adhesive sheet attached;
   a heat dissipation mechanism, comprising:
      a carrier assembly, comprises a base configured for assembling the electronic component;
      a heat dissipation assembly, comprises a top plate and a crimping unit, wherein the top plate defines a penetration hole, the crimping unit comprising an extruded sheet which is connected with one side of the top plate and is provided in correspondence with the heat-conductive adhesive sheet, the extruded sheet is located on the side of the heat-conductive adhesive sheet away from the electronic component, from the end of the extruded sheet connected to the top plate to the end of the extruded sheet away from the top plate, the extruded sheet is inclined towards the side of the heat-conductive adhesive sheet away from the electronic component, the side of the extruded sheet away from the heat-conductive adhesive sheet has a protrusion provided thereon;
      a buckle assembly, comprises a cover plate and a cladding unit, wherein the cladding unit comprises a resist member which is attached to one side of the cover plate, and inserted into the penetration hole, the resist member is configured for resisting against the extruded sheet to the heat-conductive adhesive sheet of the electronic device, the side of the resist member which facing the extruded sheet has a stop portion provided thereon, the stop portion of the resist member is configured for resting against the top plate or the protrusion; and
   a case, the electronic component and the heat dissipation mechanism being positioned in the case.

* * * * *